United States Patent [19]

Burg et al.

[11] Patent Number: 6,164,899
[45] Date of Patent: Dec. 26, 2000

[54] DISK TRANSFER APPARATUS

[75] Inventors: Marlo Burg, Council Bluffs, Iowa;
Kenneth W. Miller, Aurora, Ill.

[73] Assignee: Automated Concepts, Inc., Council Bluffs, Iowa

[21] Appl. No.: 09/298,086

[22] Filed: Apr. 22, 1999

[51] Int. Cl.⁷ .................................................. B25J 18/00
[52] U.S. Cl. ........................... 414/758; 294/1.1; 414/680
[58] Field of Search .................................... 414/680, 758, 414/763, 773, 783, 784; 294/1.1, 64.1, 27.1, 92

[56] References Cited

U.S. PATENT DOCUMENTS

| | | | |
|---|---|---|---|
| 1,538,808 | 5/1925 | Hedeen | 294/1.1 |
| 1,595,576 | 3/1926 | Guitan | 294/27.1 |
| 4,410,209 | 10/1983 | Trapani | 294/34 |
| 4,452,480 | 6/1984 | Maier et al. | 294/27.1 |
| 4,496,180 | 1/1985 | Hillman et al. | 294/64.1 |
| 4,528,643 | 7/1985 | Freeny, Jr. | 364/900 |
| 4,586,743 | 5/1986 | Edwards et al. | 294/86.4 |
| 4,775,281 | 10/1988 | Prentakis | 414/416 |
| 4,813,732 | 3/1989 | Klem | 294/103.1 |
| 4,900,212 | 2/1990 | Mikahara | 414/416 |
| 4,900,214 | 2/1990 | Ben | 414/416 |
| 5,292,222 | 3/1994 | Malagrino, Jr. et al. | 414/786 |
| 5,626,456 | 5/1997 | Nishi | 414/404 |
| 5,647,718 | 7/1997 | Wiesler et al. | 414/416 |
| 5,700,046 | 12/1997 | Van Doren et al. | 294/119.1 |
| 5,734,629 | 3/1998 | Lee et al. | 369/34 |
| 5,915,910 | 6/1999 | Howells et al. | 414/763 X |

FOREIGN PATENT DOCUMENTS 57-23238  2/1982  Japan ................................... 294/64.1

*Primary Examiner*—Donald W. Underwood
*Attorney, Agent, or Firm*—Koley Jessen P.C. A Limited Liability Organization; Mark D. Frederiksen

[57] ABSTRACT

A disk transfer apparatus includes an elongated arm which is pivotally connected at one end to a mounting block for pivotal movement through a vertical plane. A head is mounted on the free end of the arm, and has a pair of fixed, parallel jaws projecting therefrom forming a slot therebetween to receive a disk. A disk will contact the bottom of the slot between the jaws so that the forward ends of the jaws are juxtaposed through the central aperture in the disk. In this way, the disk will contact the jaws only at the edges of the inner side wall of the aperture and the outer side wall around the perimeter of the disk, during movement of the disk with the arm.

6 Claims, 4 Drawing Sheets

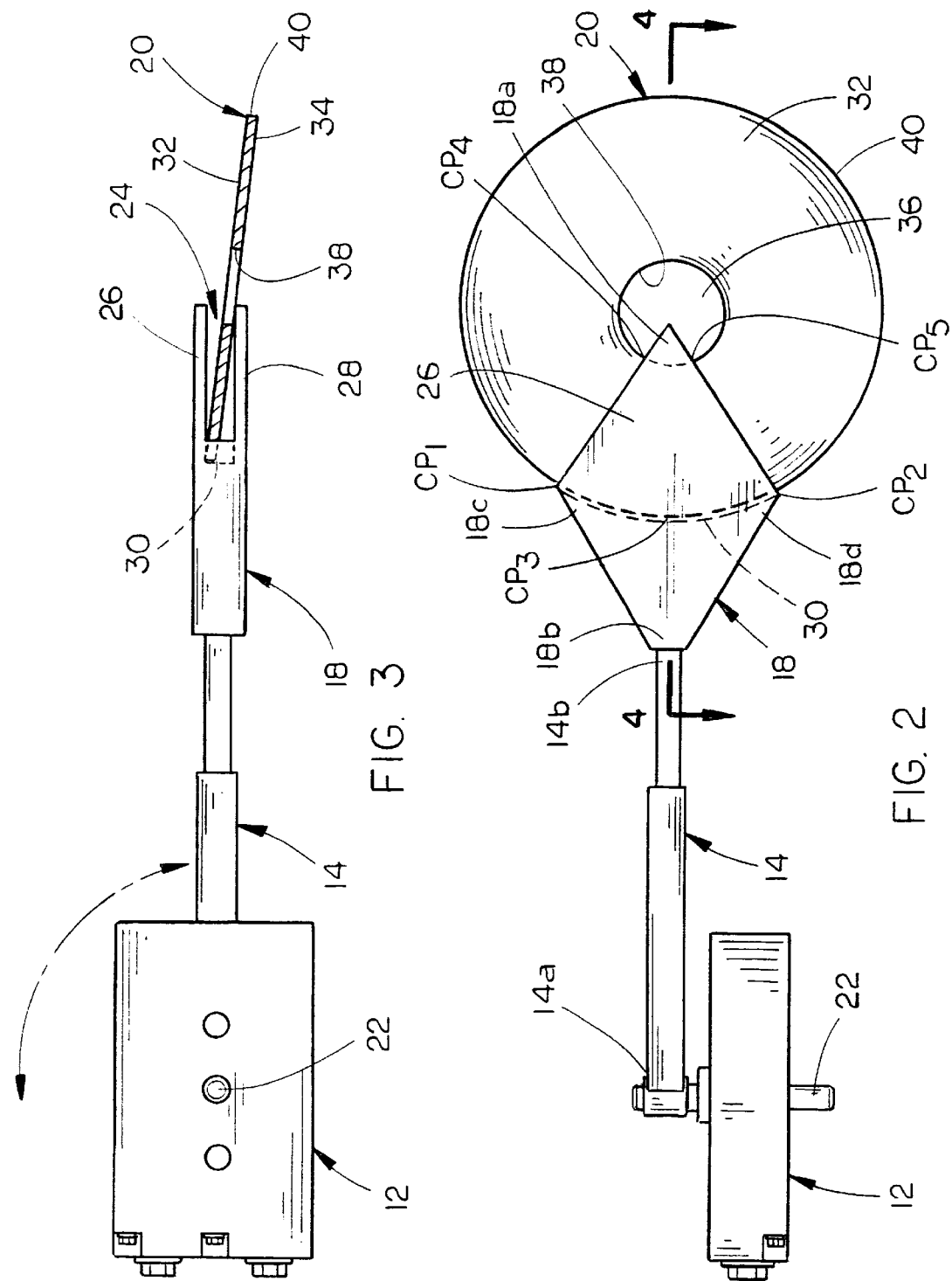

DISK TRANSFER APPARATUS

TECHNICAL FIELD

The present invention relates generally to apparatus for transporting flat disk-shaped objects, such as disks utilized in computer hard drives, and more particularly to an improved disk transfer apparatus which transfers the disk without contacting the faces of the disk.

BACKGROUND OF THE INVENTION

Computer hard drives and the like utilize disks to support and retain information thereon. In manufacturing such disks, the opposing faces of the disk are ground and polished. It is critical that neither face of the disk be touched after this polishing process, to prevent malfunction or other anomalies to data recorded on the disk.

While many apparatus are currently utilized to transfer such disks during the manufacturing process, they are all relatively complicated, and can be costly to produce and operate.

SUMMARY OF THE INVENTION

It is therefore a general object of the present invention to provide an improved disk transfer apparatus.

Another object is to provide a disk transfer apparatus which does not contact either face of a disk during the movement of the disk.

Still another object is to provide a disk transfer apparatus which is simple to operate and economical to manufacture.

These and other objects of the present invention will be apparent to those skilled in the art.

The disk transfer apparatus of the present invention includes an elongated arm which is pivotally connected at one end to a mounting block for pivotal movement through a vertical plane. A head is mounted on the free end of the arm, and has a pair of fixed, parallel jaws projecting therefrom forming a slot therebetween to receive a disk. A disk will contact the bottom of the slot between the jaws so that the forward ends of the jaws are juxtaposed through the central aperture in the disk. In this way, the disk will contact the jaws only at the edges of the inner side wall of the aperture and the outer side wall around the perimeter of the disk, during movement of the disk with the arm.

BRIEF DESCRIPTION OF THE DRAWINGS

FIG. 2 is a top plan view of the transfer apparatus;

FIG. 3 is a side elevational view of the transfer apparatus;

DESCRIPTION OF THE PREFERRED EMBODIMENT

Figure 1:
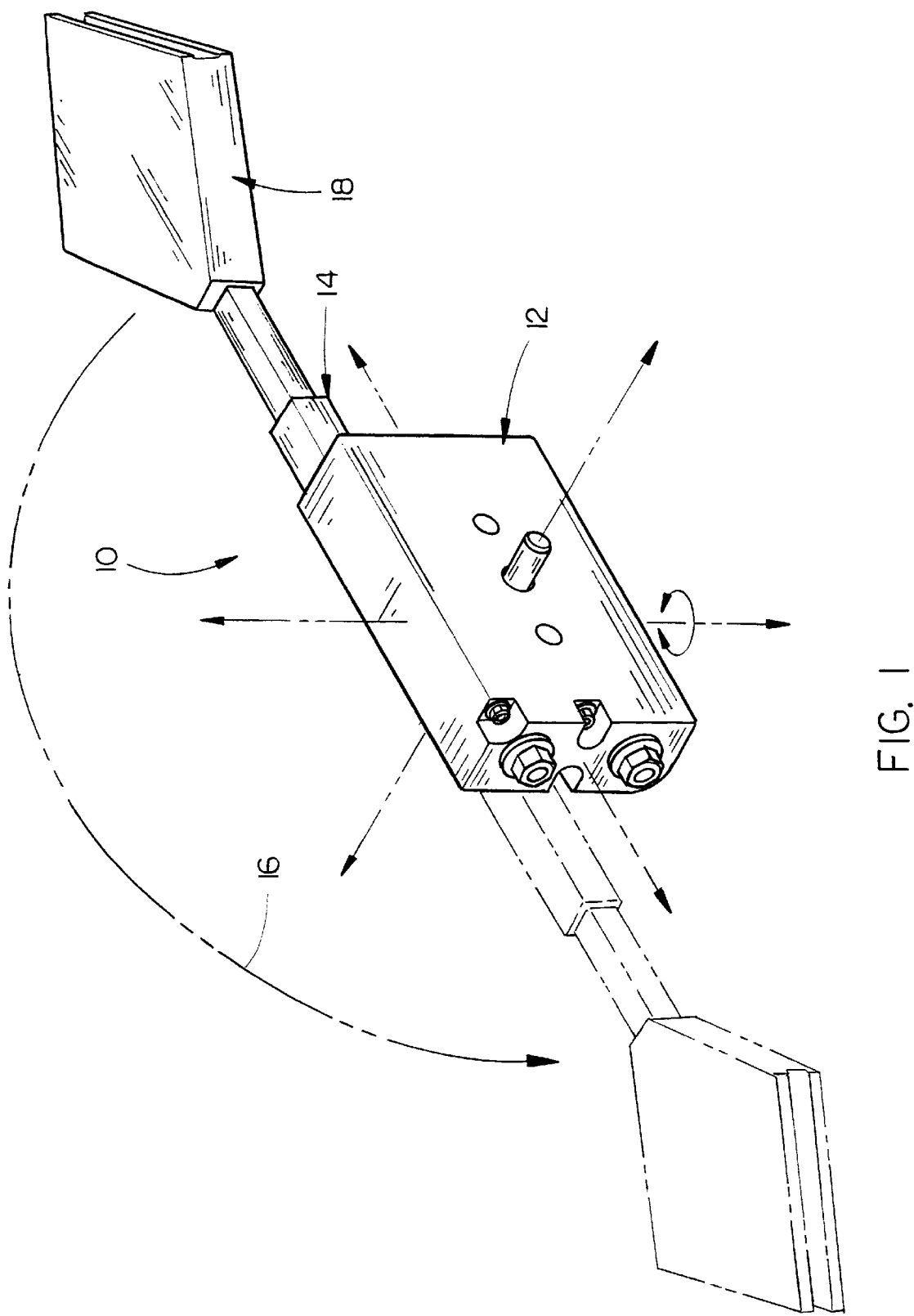
FIG. 1 is a perspective view of the transfer apparatus of the present invention.

Referring now to the drawings, in which similar or corresponding parts are identified with the same reference numeral, and more particularly to FIG. 1, the disk transfer apparatus of the present invention is designated generally at 10 and includes a mounting block 12 with an arm 14 operably mounted thereon, to pivot through a vertical plane as shown by arrow 16. A head 18 is mounted on the distal end of arm 14 to carry a disk 20 (shown in FIG. 2) from a first position within a generally horizontal plane to a second position (shown in broken line in FIG. 1) in a substantially horizontal plane, but in an inverted condition.

Referring now to FIGS. 2 and 3, mounting block 12 includes a pivot pin 22 rotatably mounted through the mounting block 12 and projecting from each side thereof. The proximal end 14a of arm 14 is mounted to a projecting end of pin 22, for rotation therewith through a vertical plane.

Head 18 is shown formed from a solid block of material in a generally diamond shape, with a forward end 18a forming a forward point of the diamond, a rearward end 18b forming a rearward point of the diamond, and opposing sides 18c and 18d forming opposing points of the diamond. A slot 24 is formed in head 18 extending rearwardly from forward end 18a to the side points 18c and 18d, and is arranged parallel to the upper and lower faces of the head 18 to form opposing plate-like jaws 26 and 28, as shown in FIG. 3. The "bottom" 30 of slot 24, extending between points 18c and 18d, is preferably curved, with a radius slightly greater than the radius of the disk 20 carried by head 18.

As discussed above, disk 20 includes opposing upper and lower faces 32 and 34, which will be ground and polished during the processing thereof. A central aperture 36 defines a cylindrical inner side wall 38 while the outer circumference defines an outer cylindrical side wall 40.

Referring again to FIG. 2, it can be seen that the distance from forward point 18a to side points 18c and 18d of head 18 is greater than the width of the disk surfaces 32 and 34, as measured between the inner side wall 38 to the outer side wall 40. Thus, when disk 20 is inserted between jaws 26 and 28, forward point 18a will overhang into aperture 36 of disk 20 when the outer side wall 40 contacts bottom 30 of slot 24. Although bottom 30 is shown as a curved surface, it should be noted that slot bottom 30 may extend rearwardly beyond the radius of the disk 20, and the only necessary contact points would be a wall or "stop" located at points 18c and 18d, such that forward point 18a is always located within aperture 36 when disk 20 is inserted into slot 24.

Figure 4:
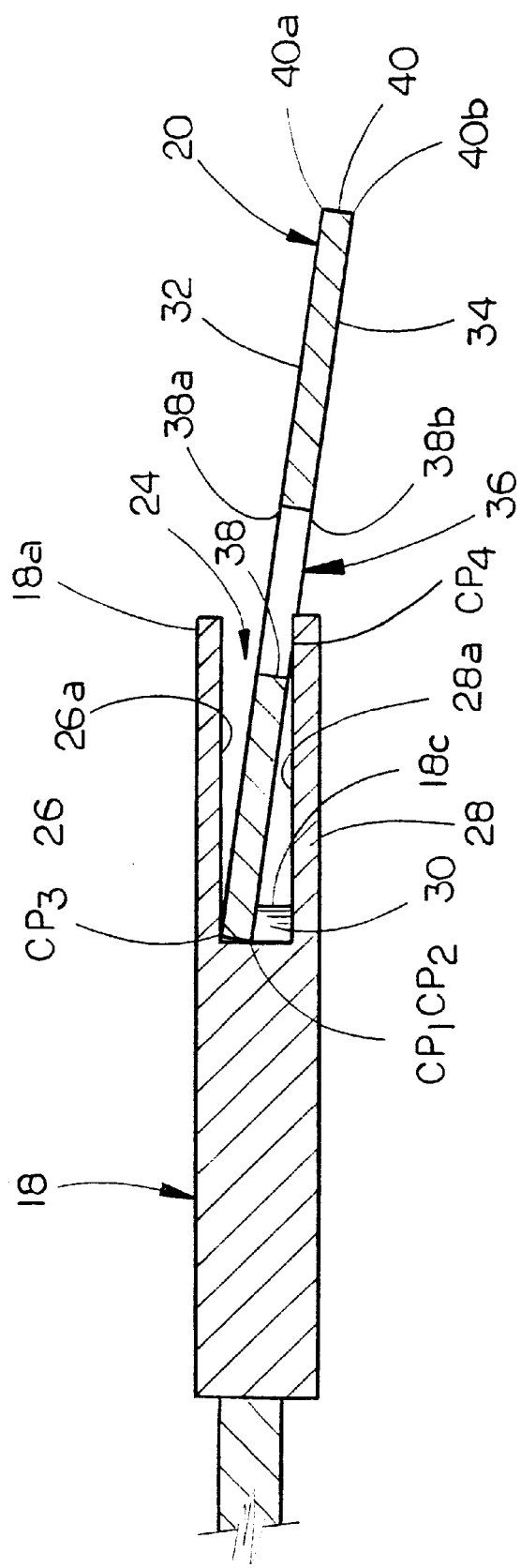
FIG. 4 is an enlarged sectional view taken at lines 4—4 in FIG. 2.

Referring now to FIG. 4, it can be seen that inner and outer side walls 38 and 40 have circular opposing upper and lower edges 38a and 38b, and 40a and 40b, where the side walls join the upper and lower faces 32 and 34 of disk 20. When disk 20 is inserted between jaws 26 and 28, it can be seen that the only contact points between disk 20 and head 18 are along the edges 38a, 38b, 40a, and 40b, thereby preventing contamination of surfaces 32 and 34. In FIG. 4, the outer side wall lower edge 40b contacts the slot bottom wall 30 to stop the disk in position with forward point 18a positioned within aperture 36. The inward surface 26a of jaw 26 contacts disk 20 only along outer side wall upper edge 40a, while the inward surface 28a of lower jaw 20a only contacts disk 20 along the inner side wall lower edge 38b. In FIG. 2, the points of contact with outer side wall lower edge 40b would be located at the points designated $CP_1$, and $CP_2$. If slot bottom surface 30 is curved at a radius which matches that of the disk outer side wall 40, then this would be a continuous point of contact extending from $CP_1$ to $CP_2$. The outer wall upper edge 40a would contact the upper jaw inward surface 26a at a single point designated as $CP_3$. Finally, the inner side wall lower edge 38b would contact lower jaw inward surface 28a at contact points $CP_4$ and $CP_5$. Thus, it can be seen that all contact between head 18 and disk 20 is along an edge 38a, 38b, 40a, or 40b. As the head 18 is moved from the first position in solid line in FIG. 1 to the second position shown in broken line in FIG. 1, the disk 20 will be supported along its outer side wall 40 as the head moves through the vertical position, and then on the opposing inner and outer side wall edges as the head moves to the second position.

Referring once again to FIGS. 2 and 3, it should be noted that arm 14 may be extendable and retractable, to permit head 18 to move laterally to receive disk 20 within jaws 26 and 28. One method of providing this lateral movement would be to provide a telescoping arm 14, although there are many equivalent methods of accomplishing this function. In addition, as shown in FIG. 1, the entire apparatus 10 may be moved within a horizontal plane, or a vertical plane, by virtue of movement of mounting block 12.

Figure 5:
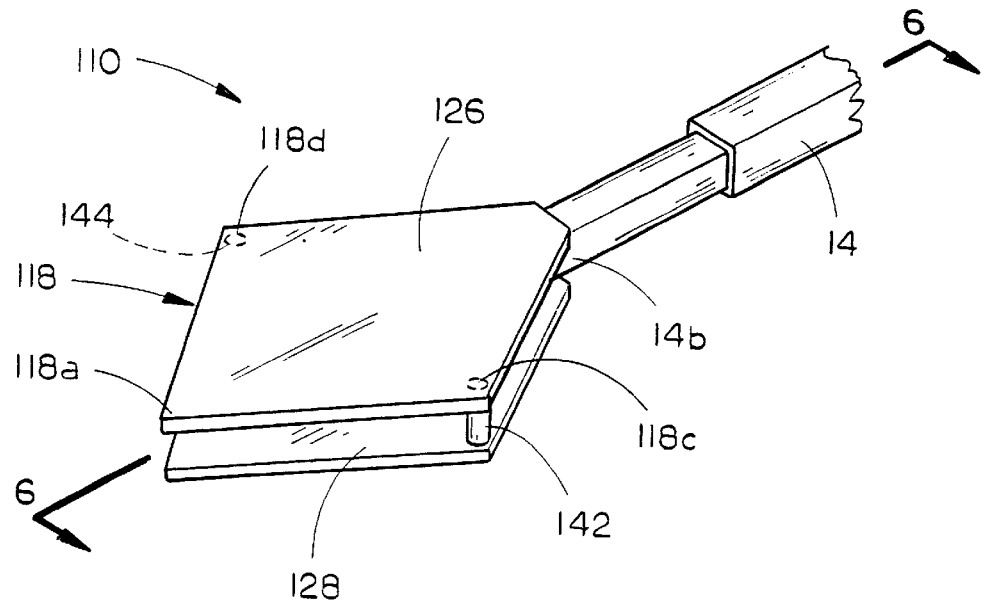
FIG. 5 is a perspective view of a second embodiment of the transfer apparatus.
Figure 6:
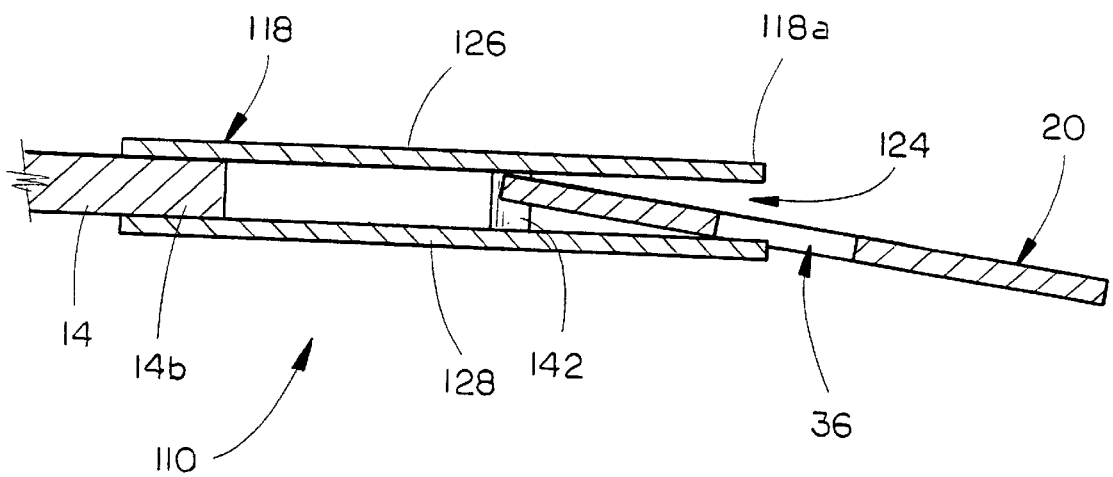
FIG. 6 is an enlarged sectional view taken at lines 6—6 in FIG. 5.

Referring now to FIGS. 5 and 6, a second embodiment of the disk transfer apparatus is designated generally at 110 and differs from the first embodiment in the formation of the head 118. In this second embodiment of the invention, head 118 is formed by a pair of upper and lower parallel spaced apart plates 126 and 128 attached to the distal end 14b of arm 14. A pair of pins 142 and 144 are mounted between plates 126 and 128 at the opposing points 118c and 118d of the diamond shaped head 118. Pins 142 and 144 form the rearward contact points for disk 20, in a fashion equivalent to the "bottom" of the slot of the first embodiment of the invention.

Whereas the invention has been shown and described in connection with the preferred embodiments thereof, many modifications, substitutions and additions may be made which are within the intended broad scope of the appended claims.

What is claimed is:

1. In combination:
   a disk having upper and lower faces, a central aperture, a cylindrical inner side wall around the aperture, and an outer cylindrical side wall connecting the perimeter of the faces; and
   a transfer apparatus for moving the disk from a first generally horizontal position, through a vertical plane to a second generally horizontal position with the faces inverted;
   said transfer apparatus including:
      an arm pivotally mounted at a first end to a mounting block, to pivot a second end of the arm through a vertical plane;
      a head mounted on the second end of the arm, with means for retaining a disk thereon as the transfer apparatus moves between the first and second positions;
   said disk retaining means including:
      a pair of spaced apart, parallel jaw members on said head extending forwardly from the arm;
      each said jaw member including a generally triangular shaped plate connected at a rearward edge to the head, and extending forwardly to a forward point;
      stop means positioned between the jaw members to prevent rearward movement of the disk beyond a position with the jaw forward points located within the disk aperture;
      said plates being mounted on the head to form a slot therebetween having a width greater than the thickness of the disk, and wherein said slot has a bottom extending between the plates, at least portions of the bottom forming said stop means;
      the slot bottom being curved to a radius substantially the same as the radius of the outer side wall of the disk;
      the forward points of the jaw members having a width less than the diameter of the disk aperture;
      the distance between the slot bottom and the jaw forward points being greater than the distance between the disk inner side wall to the disk outer side wall.

2. The combination of claim 1, wherein the head and jaw members are formed from a single integral piece of material.

3. In combination:
   a disk having upper and lower faces, a central aperture, a cylindrical inner side wall around the aperture, and an outer cylindrical side wall connecting the perimeter of the faces; and
   a transfer apparatus for moving the disk from a first generally horizontal position, through a vertical plane to a second generally horizontal position with the faces inverted;
   said transfer apparatus including:
      an arm pivotally mounted at a first end to a mounting block, to pivot a second end of the arm through a vertical plane;
      a head mounted on the second end of the arm, with means for retaining a disk thereon as the transfer apparatus moves between the first and second positions;
   said disk retaining means including:
      a pair of spaced apart, parallel jaw members on said head extending forwardly from the arm;
      each said jaw member including a generally triangular shaped plate connected at rearward edge to the head, and extending forwardly to a forward point;
      said jaw members forming a slot therebetween having a width greater than the thickness of the disk;
      stop means positioned between the jaw members to prevent rearward movement of the disk beyond a position with the jaw forward points located within the disk aperture;
      the forward points of the jaws having a width less than the diameter of the disk aperture; and
      the distance between the stop means and the jaw forward points being greater than the distance between the disk inner side wall to the disk outer side wall.

4. The combination of claim 3, wherein said plates are mounted to form a slot therebetween, and wherein said slot has a bottom extending between the plates with at least portions of the bottom forming said stop means.

5. The combination of claim 4, wherein the slot bottom is curved to a radius substantially the same as the radius of the outer side wall of the disk.

6. The combination of claim 3, wherein each jaw member triangular plate includes diverging first and second side edges, and wherein the stop means includes a first wall surface extending between the jaw members proximal the first side edges, and a second wall surface extending between the jaw members proximal the second side edges.

* * * * *